(12) United States Patent
Barber et al.

(10) Patent No.: US 8,225,472 B2
(45) Date of Patent: Jul. 24, 2012

(54) METHODS OF FABRICATING A MEMBRANE WITH IMPROVED MECHANICAL INTEGRITY

(75) Inventors: Bradley Paul Barber, Chatham, NJ (US); Linus Albert Fetter, Morganville, NJ (US); Harold Alexis Huggins, Watchung, NJ (US); Ronald Eugene Miller, Riegelsville, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 13/012,936

(22) Filed: Jan. 25, 2011

(65) Prior Publication Data

US 2011/0115338 A1   May 19, 2011

Related U.S. Application Data

(62) Division of application No. 12/185,305, filed on Aug. 4, 2008, now Pat. No. 7,895,720, which is a division of application No. 09/781,820, filed on Feb. 12, 2001, now Pat. No. 7,435,613.

(51) Int. Cl.
*H04R 17/10* (2006.01)
*B05D 5/12* (2006.01)

(52) U.S. Cl. ............ 29/25.35; 29/846; 29/847; 216/13; 216/42

(58) Field of Classification Search ............... 29/25.35, 29/594, 846, 847; 427/100, 97.3, 98.4; 216/13, 216/41, 42; 333/187; 310/321, 322, 334, 310/336, 364, 366
See application file for complete search history.

(56) References Cited

U.S. PATENT DOCUMENTS

| 2,303,457 | A | 12/1942 | Harding et al. |
| 4,445,384 | A | 5/1984 | Royer |
| 4,502,932 | A | 3/1985 | Kline et al. |
| 4,556,812 | A | 12/1985 | Kline et al. |

(Continued)

FOREIGN PATENT DOCUMENTS

JP   59023612 A   *   2/1984   ................ 29/25.35

(Continued)

OTHER PUBLICATIONS

Han et al, "Fabrication of Dome-Shaped Diaphragm with Circular Clamped Boundary on Silicon Substrate", IEEE International Conference on Micro Electro Mechanical Systems, 1999, pp. 505-510.*

(Continued)

*Primary Examiner* — A. Dexter Tugbang
(74) *Attorney, Agent, or Firm* — Mendelsohn, Drucker & Associates, P.C.; Steve Mendelsohn

(57) ABSTRACT

Forming a thin film acoustic device by patterning a layer of non-conducting material on a first side of a substrate to expose a portion of the first substrate side; depositing layers of conducting material on the layer of non-conducting material and the exposed portion of the first substrate side; depositing a layer of piezoelectric material on the layers of conducting material; depositing and patterning additional layers of material on the layer of piezoelectric material to form a first device electrode; depositing and patterning a masking layer on a second side of the substrate to expose a portion of the second substrate side; etching away the exposed substrate portion to expose the patterned layer of non-conducting material and a portion of the layers of conducting material; and etching away the exposed portion of the layers of conducting material to form a second device electrode.

10 Claims, 10 Drawing Sheets

U.S. PATENT DOCUMENTS

| | | | |
|---|---|---|---|
| 4,719,383 | A | 1/1988 | Wang et al. |
| 4,885,262 | A | 12/1989 | Ting et al. |
| 4,890,370 | A | 1/1990 | Fukuda et al. |
| 4,988,957 | A | 1/1991 | Thompson et al. |
| 5,075,641 | A | 12/1991 | Weber et al. |
| 5,166,646 | A | 11/1992 | Avanic et al. |
| 5,185,589 | A | 2/1993 | Krishnaswamy et al. |
| 5,212,988 | A | 5/1993 | White |
| 5,231,327 | A | 7/1993 | Ketcham |
| 5,232,571 | A | 8/1993 | Braymen |
| 5,233,259 | A | 8/1993 | Krishnaswamy et al. |
| 5,283,458 | A | 2/1994 | Stokes |
| 5,291,159 | A | 3/1994 | Vale |
| 5,294,898 | A | 3/1994 | Dworsky et al. |
| 5,324,683 | A | 6/1994 | Fitch et al. |
| 5,334,960 | A | 8/1994 | Penunuri |
| 5,348,617 | A | 9/1994 | Braymen |
| 5,350,965 | A | 9/1994 | Noto et al. |
| 5,354,695 | A | 10/1994 | Leedy |
| 5,367,308 | A | 11/1994 | Weber |
| 5,373,268 | A | 12/1994 | Dworsky et al. |
| 5,381,385 | A | 1/1995 | Greenstein |
| 5,403,701 | A | 4/1995 | Lum et al. |
| 5,404,628 | A | 4/1995 | Ketcham |
| 5,438,554 | A | 8/1995 | Seyed-bolorforosh et al. |
| 5,446,306 | A | 8/1995 | Stokes et al. |
| 5,552,655 | A | 9/1996 | Stokes et al. |
| 5,587,620 | A | 12/1996 | Ruby et al. |
| 5,596,239 | A | 1/1997 | Dydyk |
| 5,608,362 | A | 3/1997 | Nishimura et al. |
| 5,617,065 | A | 4/1997 | Dydyk |
| 5,630,949 | A | 5/1997 | Lakin |
| 5,646,583 | A | 7/1997 | Seabury et al. |
| 5,656,882 | A | 8/1997 | Lazarus et al. |
| 5,692,279 | A | 12/1997 | Mang et al. |
| 5,698,928 | A | 12/1997 | Mang et al. |
| 5,702,775 | A | 12/1997 | Anderson et al. |
| 5,714,917 | A | 2/1998 | Ella |
| 5,739,563 | A | 4/1998 | Kawakubo et al. |
| 5,760,663 | A | 6/1998 | Pradal |
| 5,780,713 | A | 7/1998 | Ruby |
| 5,789,845 | A | 8/1998 | Wadaka et al. |
| 5,821,833 | A | 10/1998 | Lakin |
| 5,853,601 | A | 12/1998 | Krishaswamy et al. |
| 5,864,261 | A | 1/1999 | Weber |
| 5,869,354 | A | 2/1999 | Leedy |
| 5,872,493 | A | 2/1999 | Ella |
| 5,873,153 | A | 2/1999 | Ruby et al. |
| 5,873,154 | A | 2/1999 | Ylilammi et al. |
| 5,883,575 | A | 3/1999 | Ruby et al. |
| 5,884,378 | A | 3/1999 | Dydyk |
| 5,894,647 | A | 4/1999 | Lakin |
| 5,910,756 | A | 6/1999 | Ella |
| 5,915,203 | A | 6/1999 | Sengupta et al. |
| 5,928,598 | A | 7/1999 | Anderson et al. |
| 5,942,958 | A | 8/1999 | Lakin |
| 5,963,856 | A | 10/1999 | Kim |
| 5,965,968 | A | 10/1999 | Robert et al. |
| 6,020,257 | A | 2/2000 | Leedy |
| 6,051,907 | A | 4/2000 | Ylilammi |
| 6,060,818 | A | 5/2000 | Ruby et al. |
| 6,069,433 | A | 5/2000 | Lazarus et al. |
| 6,081,171 | A | 6/2000 | Ella |
| 6,087,198 | A | 7/2000 | Panasik |
| 6,127,768 | A | 10/2000 | Stoner et al. |
| 6,150,703 | A | 11/2000 | Cushman et al. |
| 6,198,208 | B1 | 3/2001 | Yano et al. |
| 6,204,737 | B1 | 3/2001 | Ella |
| 6,215,375 | B1 | 4/2001 | Larson, III et al. |
| 6,291,927 | B1 | 9/2001 | Percin et al. |
| 6,351,055 | B1 | 2/2002 | Futakuchi et al. |
| 6,475,317 | B1 | 11/2002 | Baba et al. |
| 6,486,588 | B2 | 11/2002 | Doron et al. |
| 6,566,983 | B2 | 5/2003 | Shin |
| 6,617,751 | B2 | 9/2003 | Sunwoo et al. |

FOREIGN PATENT DOCUMENTS

| | | | |
|---|---|---|---|
| JP | 02052513 | 2/1990 | |
| JP | 06180326 A | * 6/1994 | ................. 29/25.35 |

OTHER PUBLICATIONS

Lakin et al, "Solidly Mounted Resonators and Filters", IEEE Proceedings of Ultrasonics Symposium, 1995, vol. 2, pp. 905-908.*

Restriction Requirement; Mailed on Jun. 3, 2002 for corresponding U.S. Appl. No. 09/781,820, filed Feb. 12, 2001; 5 pages.

Non-Final Office Action; Mailed on Oct. 6, 2003 for corresponding U.S. Appl. No. 09/781,820, filed Feb. 12, 2001; 6 pages.

Non-Final Office Action; Mailed on Apr. 7, 2004 for corresponding U.S. Appl. No. 09/781,820, filed Feb. 12, 2001; 8 pages.

Final Office Action; Mailed on Jun. 15, 2004 for corresponding U.S. Appl. No. 09/781,820, filed Feb. 12, 2001; 7 pages.

Non-Final Office Action; Mailed on Sep. 17, 2007 for corresponding U.S. Appl. No. 09/781,820, filed Feb. 12, 2001; 8 pages.

Final Office Action; Mailed on Mar. 21, 2008 for corresponding U.S. Appl. No. 09/781,820, filed Feb. 12, 2001; 8 pages.

Notice of Allowance and Fees Due; Mailed on Jun. 27, 2008 for corresponding U.S. Appl. No. 09/781,820, filed Feb. 12, 2001; 4 pages.

Restriction Requirement; Mailed on Oct. 13, 2009 for corresponding U.S. Appl. No. 12/185,305, filed Aug. 4, 2008; 10 pages.

Non-Final Office Action; Mailed on May 12, 2010 for corresponding U.S. Appl. No. 12/185,305, filed Aug. 4, 2008; 8 pages.

Notice of Allowance and Fees Due; Mailed on Oct. 22, 2010 for corresponding U.S. Appl. No. 12/185,305, filed Aug. 4, 2008; 5 pages.

* cited by examiner

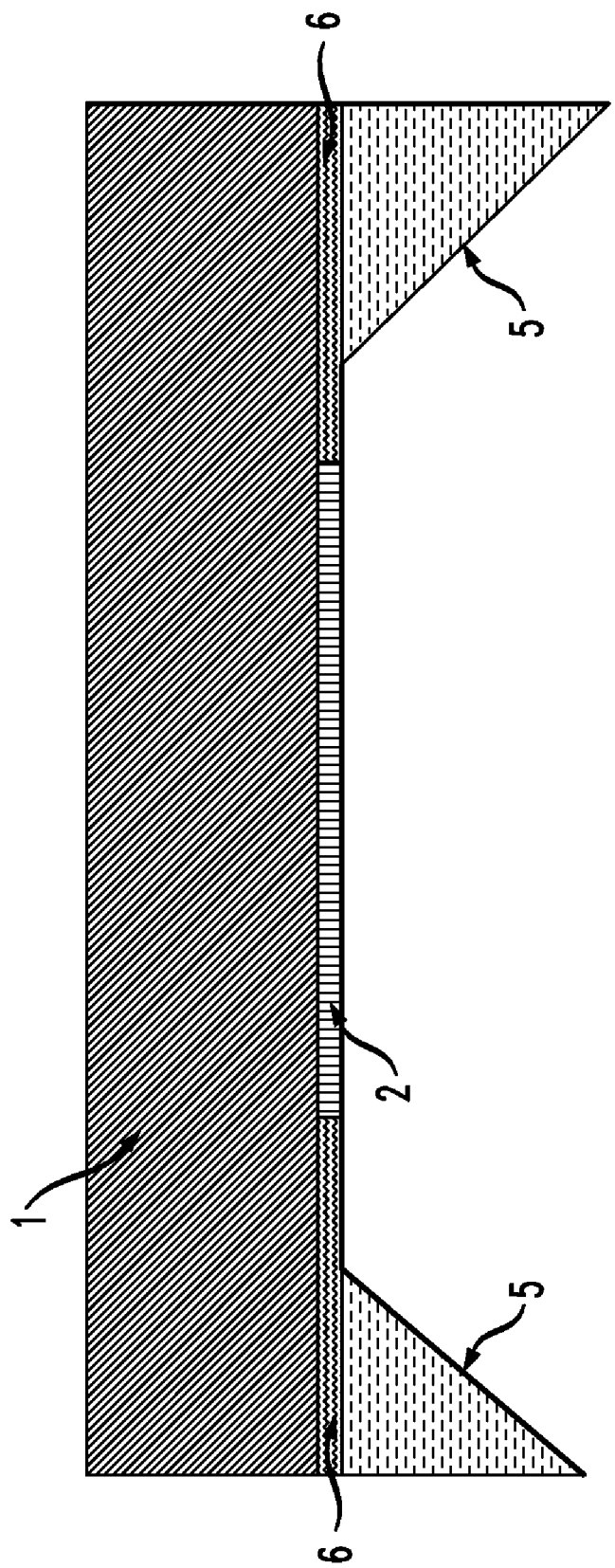

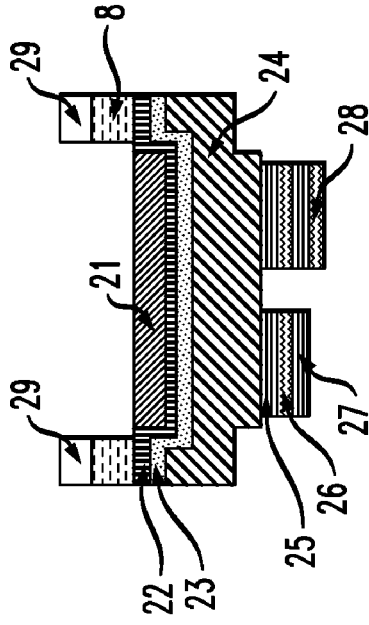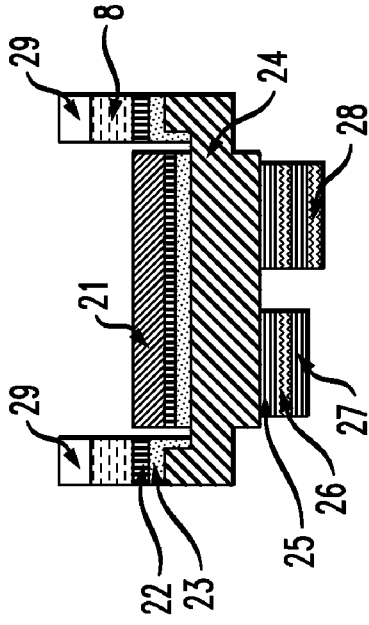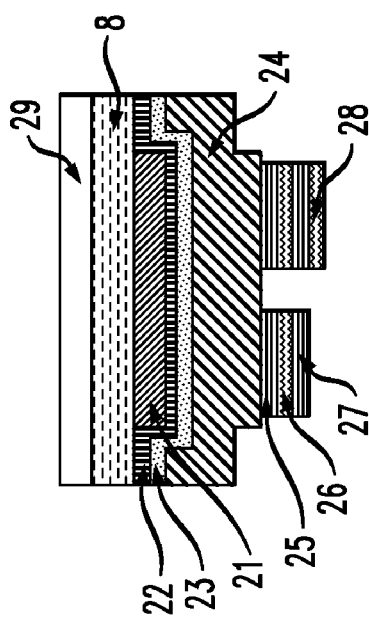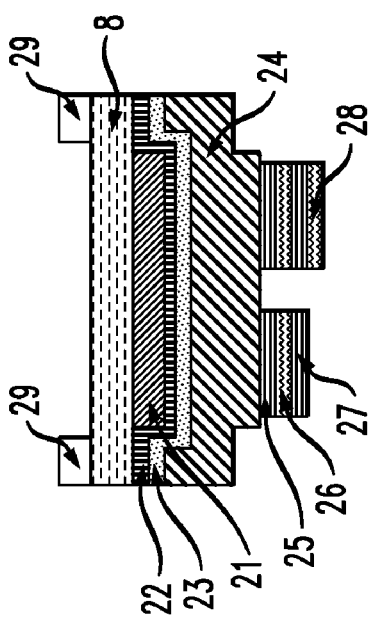

METHODS OF FABRICATING A MEMBRANE WITH IMPROVED MECHANICAL INTEGRITY

CROSS-REFERENCE TO RELATED APPLICATIONS

This is a divisional of application Ser. No. 12/185,305, filed on Aug. 4, 2008 and issued as U.S. Pat. No. 7,895,720 on Mar. 1, 2011, which is a divisional of application Ser. No. 09/781,820, filed on Feb. 12, 2001 and issued as U.S. Pat. No. 7,435,613 on Oct. 14, 2008, the teachings of both of which are incorporated herein by reference.

BACKGROUND OF THE INVENTION

1. Field of the Invention

The invention pertains to the field of membrane release technology. More particularly, the invention pertains to the fabrication of membranes with improved mechanical integrity.

2. Description of Related Art

Thin film resonators (TFRs) are thin film acoustic devices which can resonate in the radio frequency (RF) to microwave range, for example, 0.5 to 5 Gigahertz (GHz), in response to an electrical signal. A typical TFR has a piezoelectric film between a first electrode and a second electrode which apply an electric field to the piezoelectric film. The film is made of a piezoelectric crystalline material, such as zinc oxide, aluminum nitride (AlN) or other piezoelectric crystalline material, which exhibits a piezoelectric effect. The piezoelectric effect occurs when the piezoelectric material expands or contracts in response to an electric field applied across the piezoelectric material, for example by the first and second electrodes, or produces charge or current in response to mechanical stress or strain applied to the piezoelectric material. The mechanical resonance frequency (fr) of the film, is defined for a film of uniform thickness as the acoustic velocity (v) in the film divided by two (2) times the thickness (t) of the film or $fr=v/2t$.

If an RF source is used to apply an alternating electric field of variable frequency to a piezoelectric film, there will be a pronounced response in the mechanical motion of the piezoelectric film as the frequency of the source varies near the film's mechanical resonance frequency. The fact that the piezoelectric film thus yields different amounts of current at different frequencies makes it a useful element in electrical filters, oscillators, or frequency control circuits.

TFRs can be used at radio frequency because piezoelectric films can be deposited as thin films. For example at higher frequencies, such as 0.5-10 GHz, the piezoelectric film can be between 0.4 and 8 microns in thickness. Piezoelectric resonators needed for these higher frequency applications can be made by using techniques similar to those used to manufacture integrated circuits. The TFR structure can be formed on the substrate, such as a silicon (Si), gallium arsenide (GaAs) or other semiconductor substrate, for monolithic integration purposes, such as integration with active semiconductor devices.

However, because the device's response is acoustic (mechanical) in nature, care must be taken to avoid loss of a signal's energy through mechanical coupling to its support structure, the substrate. Methods for accomplishing the necessary isolation include fabricating the devices on (acoustic) reflecting mirrors or fabricating the devices on membrane support structures. The later technique is the principle topic of the current proposal.

Thin film-resonator-based radio frequency filters are made through thin film depositions, each followed by one or more processing steps. For 2 GHz applications, a 25,000 Angstroms thick piezoelectric film is deposited over a 2,000 Angstrom thick base electrode, which provides electrical connectivity between resonators. The piezoelectric film typically extends across the edges of this patterned base electrode, but film growth tends to be discontinuous in these regions. If attempts are made to fabricate a freestanding membrane from such a segmented film, the cracks at these discontinuities cause the membrane—and the device—to literally fall apart.

There is a need in the art for methods to improve the mechanical integrity of freestanding membranes. Specifically, a fabrication method which avoids destruction of a membrane due to substrate topology is needed.

SUMMARY OF THE INVENTION

Methods for fabricating robust films across a patterned underlying layer's edges or steps are disclosed. The novel methods diminish the negative effects of electrode steps or edges on the integrity of a membrane. Thus, the methods are particularly applicable to membrane release technology. The height of the step or edge is eliminated or reduced to increase the mechanical integrity of the film.

In the first embodiment of the invention, a material of equal or comparable height as the base electrode is placed adjacent to the electrode. This placement is achieved through any of a variety of techniques, including chemical mechanical polishing (CMP) planarization, polymer planarization and etch, or polymer reflow with liftoff.

In another embodiment, a single large electrode step is made into smaller multiple steps by depositing multiple layers of selectively etchable materials. Subsequent cycles of etching lead to a "staircase" with a lessening of the detrimental material weakening.

In a third embodiment of the invention, a continuously smoothed dome instead of a staircase is achieved through specific use of lithography, deposition and etch.

In another embodiment of the invention, a non-conducting material is patterned in the same manner as the final electrode pattern. This material ultimately acts as a mask for patterning the base electrode at the end of the process.

BRIEF DESCRIPTION OF THE DRAWINGS

FIG. 3 shows a schematic representation of a device of the first embodiment of the present invention which contains a piezoelectric film deposited on an electrode and an additional layer to prevent cracking of the piezoelectric film and membrane.

FIG. 8F shows a schematic representation of the device of FIG. 8E, after the deposition of a piezoelectric film on the backside of the device.

FIG. 8G shows a schematic representation of the device of FIG. 8F, after the piezoelectric film has been patterned.

FIG. 8H shows a schematic representation of the device of FIG. 8G, after an reactive ion etching etch which reaches to the non-conducting layer has been performed.

FIG. 8I shows a schematic representation of the device of FIG. 8H, after a second reactive ion etching etch has patterned the unmasked metallic layers.

DETAILED DESCRIPTION OF THE INVENTION

Figure 1:
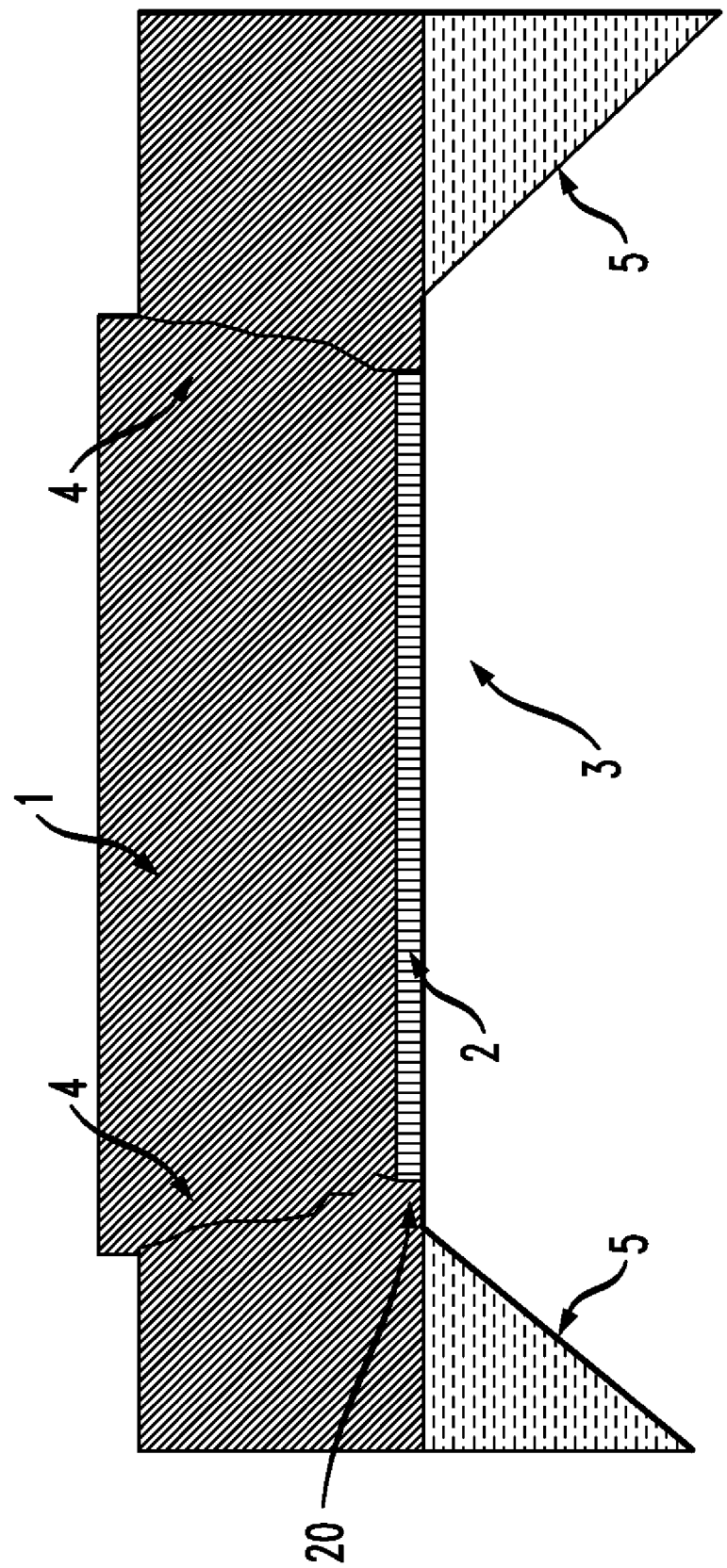
FIG. 1 shows a prior art piezoelectric film, having cracks at a discontinuity.

FIG. 1 illustrates an AlN resonator in the prior art. The piezoelectric film is made of a piezoelectric crystalline material, such as zinc oxide, aluminum nitride (AlN) or other piezoelectric crystalline material. In these descriptions, the piezoelectric film also serves as the device support membrane. However, these techniques could also be applied to a film added to the structure as a support membrane only.

Only the edges of the membrane are supported on an etched substrate (5), such as silicon (Si) or gallium arsenide (GaAs). The topology inherent in patterning the electrode (2) in this device leads to a loss of membrane integrity. Specifically, cracks (4) are propagating from the electrode (2) step or edge (20) and through the piezoelectric film (1). The piezoelectric film (1) cracks (4) at the step or edge (20) where the electrode (2) ends. As a result, the device falls apart.

Methods for improving yield and stability of membrane films crossing surface topology are disclosed in this invention. The methods all diminish the effects of the electrode edges by eliminating or reducing the height of the edge.

Although these fabrication methods are particularly useful for mechanical strengthening of membrane films over an underlying patterned layer in TFR devices, the invention is applicable in the context of any Micro-Electronic-Mechanical System (MEMS).

In the first embodiment of the invention, the elimination of the edge through placement of a material adjacent to the base electrode of equal or comparable height is achievable through multiple processes. These processes include chemical mechanical polishing (CMP) planarization, polymer planarization, and polymer reflow with liftoff. In each process, the height of the step or edge (20) from FIG. 1 is eliminated or reduced through placement of a material adjacent to the electrode (2) of equal or comparable height.

Figure 2A:
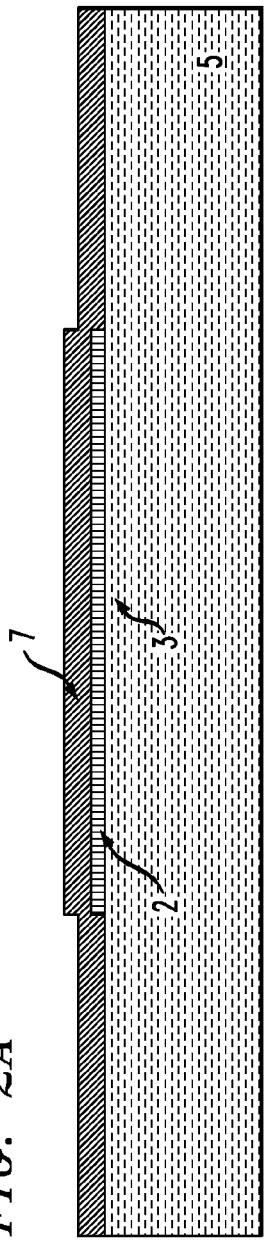
FIG. 2A shows a schematic representation of a sacrificial film deposited on an as-fabricated membrane, the starting material for chemical mechanical polishing planarization in a first embodiment of the invention.
Figure 2B:
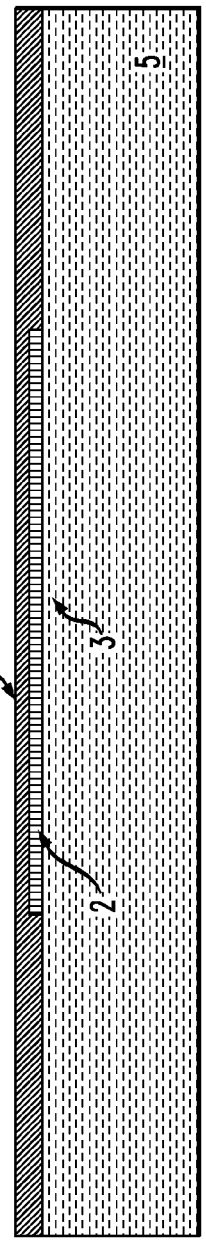
FIG. 2B shows a schematic representation of the membrane of FIG. 2A, after a chemical mechanical polishing step.
Figure 2C:
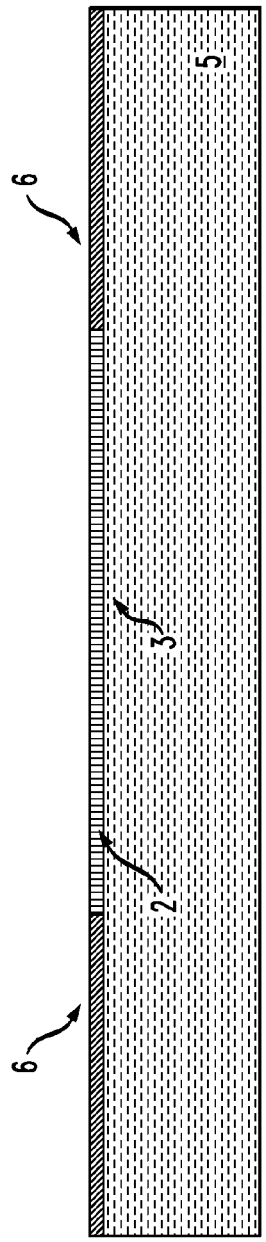
FIG. 2C shows the membrane of FIG. 2B, after an reactive ion etching step.

FIGS. 2A through 2C illustrate the generic planarization process. First, a sacrificial film (7) roughly twice the thickness of the electrode is deposited over the patterned electrode (2), resulting in FIG. 2A. Preferred metals for the electrode (2) include aluminum and titanium, but may be any suitably conducting element or compound. The sacrificial film (7) is a non-conductive material, preferably with a low dielectric constant. Although the preferred material for this film is $SiO_2$, other insulating oxides such as $Ta_2O_5$ or nitrides such as SiN may also be useful.

The next step in the process utilizes chemical mechanical polishing. Chemical mechanical polishing combines chemical etching with mechanical abrasion to specifically etches peaks faster than valleys. Consequently, this process planarizes the sacrificial film (7) and results in the intermediate device shown in FIG. 2B.

A reactive ion etching step is then performed to reduce the thickness of the sacrificial film (7) to that of the electrode (2) layer, thus exposing the electrode (2) and providing an adjacent step-eliminating layer (6). Reactive ion etching is the removal of material in a chamber into which reactive gases are introduced to chemically attack the surface to be removed. The device which results from this step is shown in FIG. 2C.

Referring also to FIG. 3, subsequent deposition of a piezoelectric film (1) has been performed on the planarized surface. Preferred materials for the piezoelectric film include aluminum nitride, and zinc oxide. Due to the addition of the step-eliminating layer (6), the film has more mechanical integrity than the films in the prior art (see FIG. 1). The introduction of the planarizing layer reduces the substrate topology created by the electrode (2), to the extent that cracks do not form in the piezoelectric film (1) or the underlying membrane (3).

Because the membrane is so delicate, the membrane release is one of the last steps in the fabrication sequence.

As shown in FIGS. 4A-4E, an alternative process for producing an additional layer adjacent to the electrode is polymer planarization.

In this process, the substrate (8) is first masked and etched with the base metal pattern. Suitable etching processes include reactive ion etching, wet chemistry or focus ion beam milling (FIB). As discussed above, reactive ion etching is the removal of material in a chamber into which reactive gases are introduced to chemically attack the surface to be removed. The removal process in FIB bombards the masked surface of the material with high-energy ions from an ionized plasma. Wet chemistry uses known chemicals to dissolve and "react away" material from a substrate in a wet chemical bath. For example, aluminum and many other materials can be chemically etched in hydrofluoric acid.

Figure 4A:
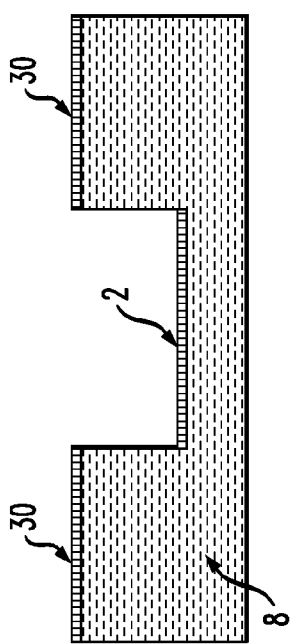
FIG. 4A shows a schematic representation of a patterned, electrode-coated substrate, the starting material for polymer planarization in a first embodiment of the invention.

Following removal of the masking material, the electrode material ((2) and (30)) is deposited over the entire surface of the patterned substrate (8). The deposition technology employed results in the electrode ((2) and (30)) being discontinuous over the vertical surfaces of the substrate, as shown in FIG. 4A.

Figure 4C:
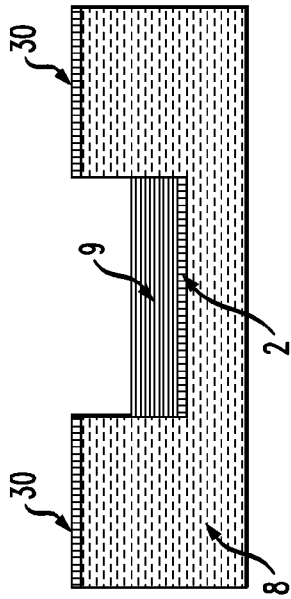
FIG. 4C shows a schematic representation of the device of FIG. 4B, after etching of the polymer.
Figure 4D:
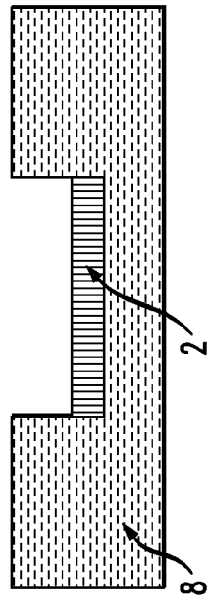
FIG. 4D shows a schematic representation of the device of FIG. 4C, after the surface electrode is etched and the polymer is removed.
Figure 4E:
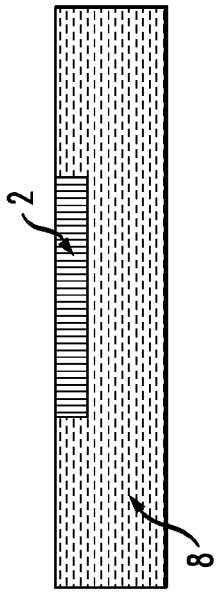
FIG. 4E shows a schematic representation of the device of FIG. 4D, after the substrate is etched to the level of the electrode.
Figure 4B:
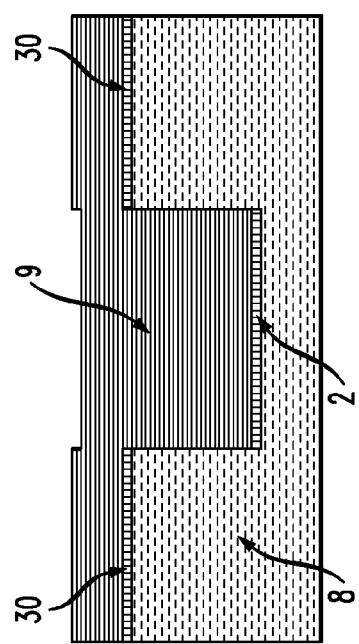
FIG. 4B shows a schematic representation of the device of FIG. 4A, after the deposition of a polymer.

A non-conforming polymer (9) is next spun on, resulting, as illustrated in FIG. 4B, in more polymer (9) remaining in the etched pits than on the wafer surface. Several companies sell this polymer material in proprietary formulations. They usually consist of a chemical polymer dissolved in casting solvent. The solvent is driven out in a subsequent baking step. A polymer material which has been used in this step of the invention is Allied 311 Spin-On-Glass, manufactured by Allied Signal.

Due to this difference in polymer thickness, a subsequent reactive ion etching step removes the polymer (9) from the surface before this material is cleared in the pit, as shown in FIG. 4C.

The exposed electrode (30) is then dry etched, so that the electrode (30) on the upper surface is etched away, while the remaining polymer (9) protects the electrode material (2) in the recessed region. Subsequent removal of all polymer results in the intermediate device illustrated in FIG. 4D.

The remaining electrode (2) then acts as a mask for etching the exposed substrate (8). This etching continues until sufficient substrate (8) has been removed to achieve the desired planarized surface shown in FIG. 4E.

Subsequent deposition of a piezoelectric film (1) and removal of the majority of the substrate (8) results in the membrane device shown in FIG. 3.

Figure 5A:
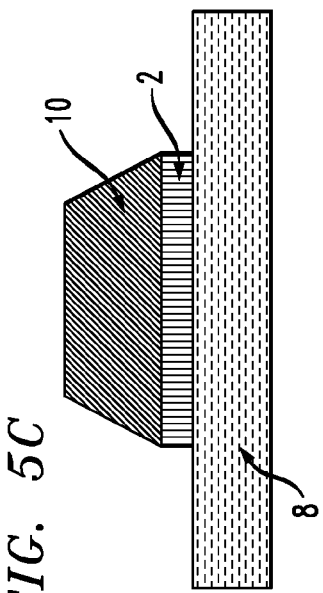
FIG. 5A shows a schematic representation of a device with a substrate, an electrode, and a patterned resist, the starting material for re-flow and lift-off in a first embodiment of the invention.
Figure 5C:
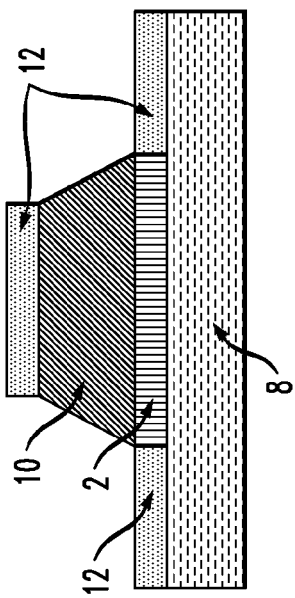
FIG. 5C shows a schematic representation of the device of FIG. 5B, after the step of applying reflow resist to the device.
Figure 5E:
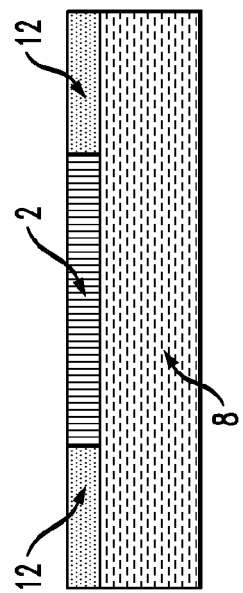
FIG. 5E shows a schematic representation of the device of FIG. 5D, after the resist is removed.

As a final process for the first embodiment, a re-flow and lift-off technique is shown in FIGS. 5A-5E. As shown in FIG. 5A, a layer of resist (10) is first applied and patterned to act as an etch mask for the electrode (2). Photo resist is a polymer material which is well known in the industry. It is also supplied in proprietary formulations by a variety of manufacturers, such as Microposit 1818, available from Shipley.

Figure 5B:
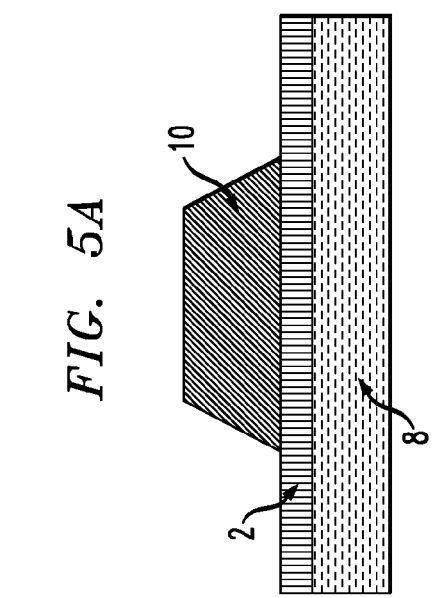
FIG. 5B shows a schematic representation of the device of FIG. 5A, after etching the electrode, thus creating an undercut.

The electrode (2) is then etched using wet chemistry. Because wet chemical etching is an isotropic process—i.e., it etches at the same rate both horizontally and vertically—this step removes some of the electrode material from underneath the resist edge and creates an undercut profile (11) as shown in FIG. 5B.

Following this etch, the resist (10) is baked (re-flowed) above its glass-transition temperature. During this step, the surface tension of the molten resist causes the resist edge to retract to the edge of the electrode (2). This step results in the intermediate device shown in FIG. 5C.

Figure 5D:
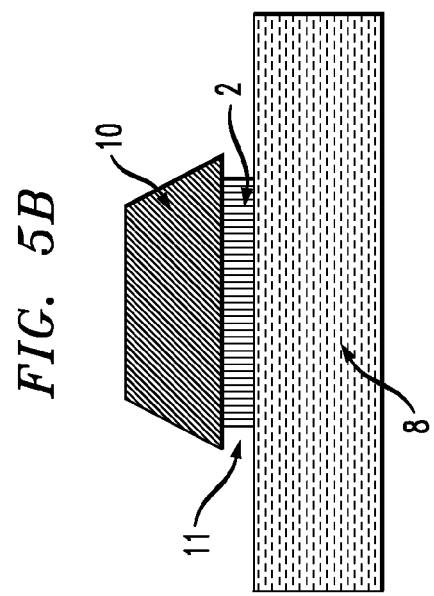
FIG. 5D shows a schematic representation of the device of FIG. 5C, after the deposition of a planarization layer.

A planarizing film (12) is then deposited over the entire surface of the device. The planarizing film (12) is approximately the same thickness as the electrode (2), and tends to be discontinuous across the edge of the resist (10). The planarizing film (12) is preferably a non-conducting material with a low dielectric constant, such as $SiO_2$. FIG. 5D shows the planarizing film (12) covering the entire surface of the device.

"Lift off" is accomplished by a subsequent immersion in a liquid resist solvent. This step removes the resist (10) and any planarizing film (12) overlying it, and results in the planar surface illustrated in FIG. 5E.

Subsequent deposition of a piezoelectric film (1) and removal of the majority of the substrate (8) results in the membrane device shown in FIG. 3.

In another embodiment of the invention, a single large electrode step can be made into smaller multiple steps by depositing multiple layers of selectively etchable materials. Subsequent cycles of etching lead to a "staircase" with a lessening of the detrimental material weakening. FIGS. 6A-6E illustrate an implementation of this embodiment.

First, multiple layers (14), (15), (16), (17), (18), and (19) of selectively etchable materials are deposited; these layers collectively form the base metal. In this example, layers (14), (16), and (18) are composed of Al, while layers (15), (17), and (19) are composed of Ti. Although there are six layers shown in this example, any number of layers may be used to create the stair-step electrode in this embodiment. As shown in the example, adjacent layers have mutually exclusive etch chemistry, while every other layer is composed of the same metal, allowing selective etching of the layers.

Ti/Al has been used in this embodiment of the invention because the Ti enables oriented growth of the Al, which in turn enables oriented growth of AlN. Though they do share common etchants, we exploit the fact that there are also acids which attack one without attacking the other.

Figure 6A:
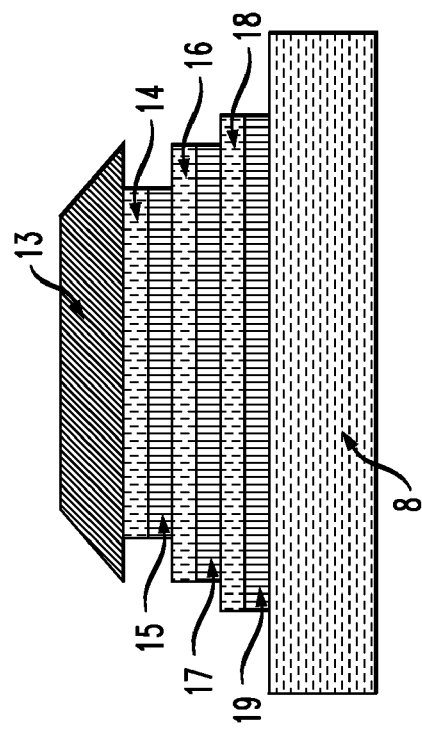
FIG. 6A shows a schematic representation of a device containing a patterned resist layer over a metal stack, the starting material for creating a stair-step electrode in a second embodiment of the invention.
Figure 6C:
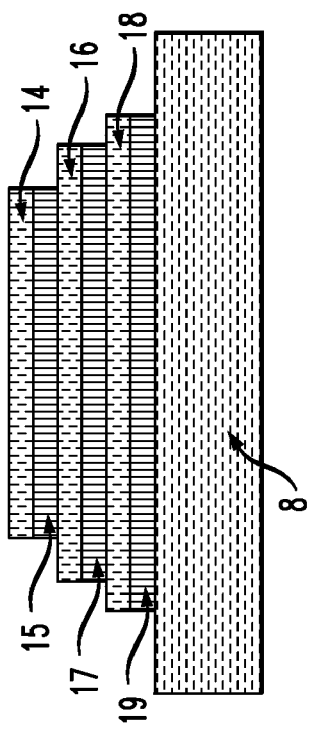
FIG. 6C shows a schematic representation of the device of FIG. 6B, after the completion of the etch of all of the metal layers.

A layer of resist (13) is next deposited on the top layer (14) and then patterned. The result of these steps is shown in FIG. 6A.

Figure 6B:
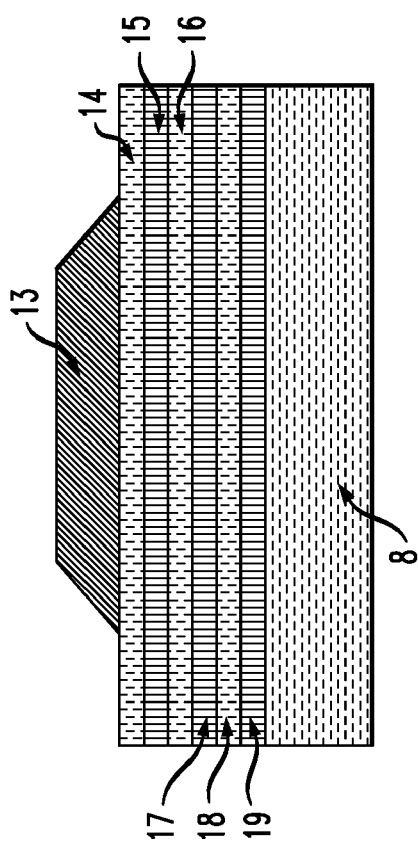
FIG. 6B shows a schematic representation of the device of FIG. 6A, after the top two metal layers have been etched.

In the next step, the upper metallic layer (14) is etched in a solvent which does not attack the adjacent layer (15). Then, a different chemical composition, again chosen not to attack adjacent layers, is used to etch layer (15). The result of etching the first two layers (14) and (15) is shown in FIG. 6B. Each layer pair is etched to roughly the same profile. Subsequent immersions in the appropriate etch then cause each of the previous layers to recede further.

Etching the third metallic layer (16) results in further lateral etching of the first layer (14) because layers (14) and (16) are composed of the same metal and therefore have the same etching characteristics. Similarly, by etching the fourth layer (17), the second layer (15) also experiences further lateral etching. Etching of the fifth layer (18) also etches layers (14) and (16), while etching of the last electrode layer (19) further etches layers (15) and (17). Proper timing of these etches results in the "stair step" profile shown in FIG. 6C.

In the example using Ti and Al, an aluminum etchant preferably includes phosphoric, acetic and nitric acids is used to etch the even numbered layers (14), (16), and (18), while a titanium etchant preferably includes ammonium hydroxide ($NH_4OH$) and EDTA etches the odd-numbered layers (15), (17), and (19). The aluminum etchant does not affect the titanium, and the titanium etch does not attack the aluminum.

Figure 6D:
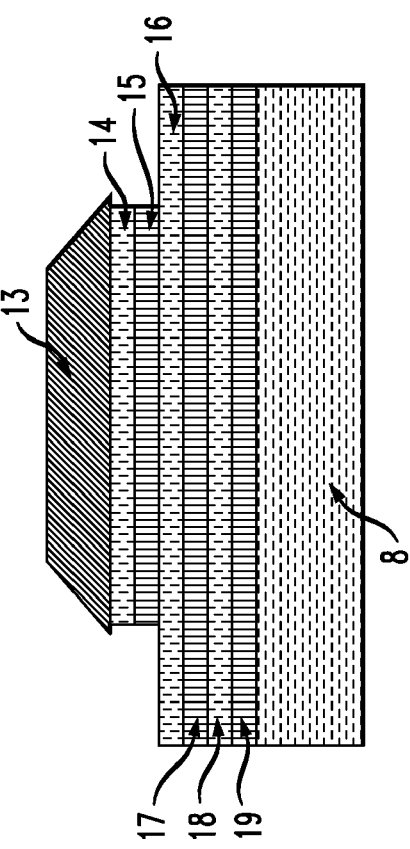
FIG. 6D shows a schematic representation of the device of FIG. 6C, after the removal of the resist.

The resist (13) is then removed, resulting in the stair-step electrode shown in FIG. 6D.

Figure 6E:
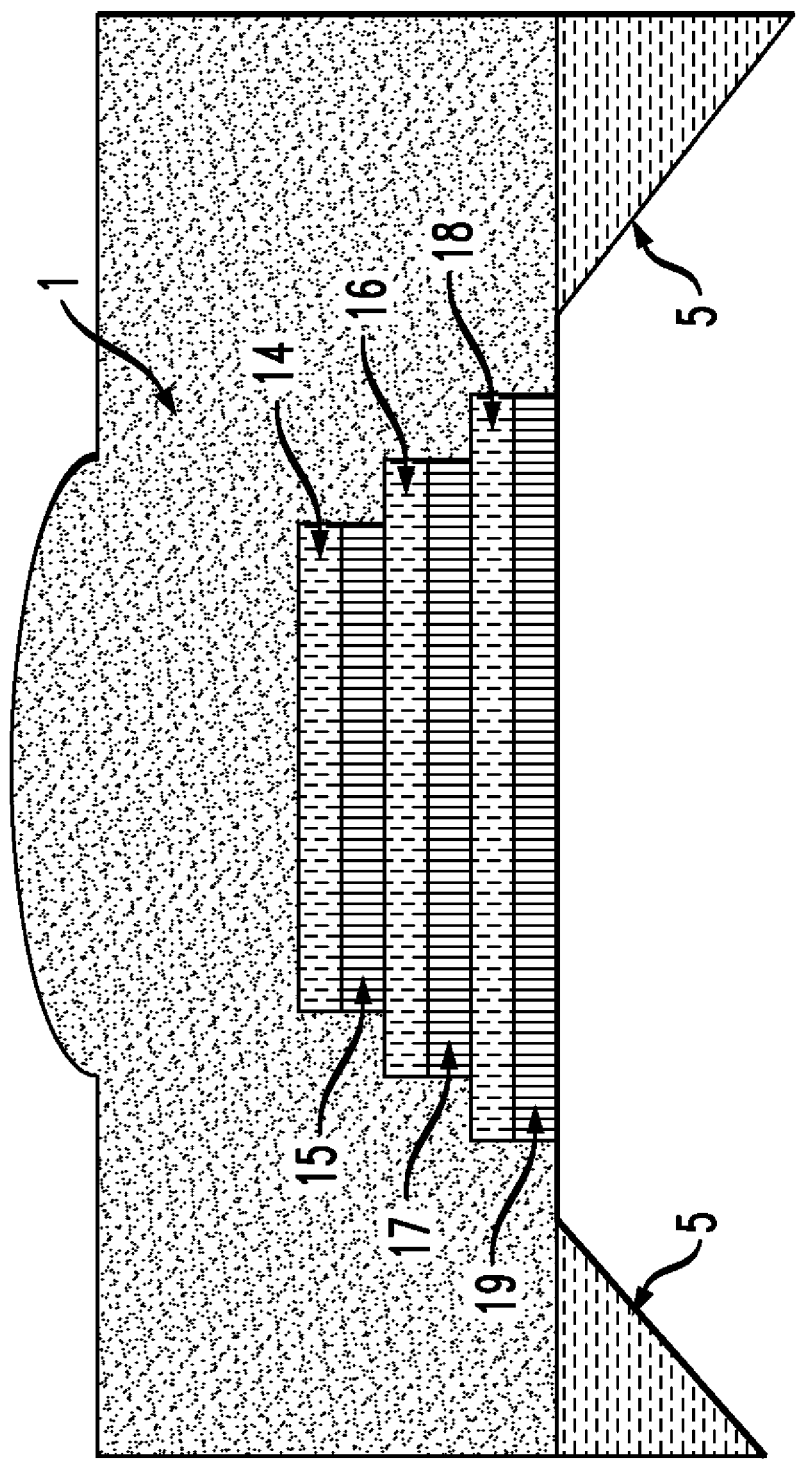
FIG. 6E shows a schematic representation of the device of FIG. 6D, after the addition of a piezoelectric film and the removal of the substrate.

To complete the membrane device, a piezoelectric film (1) is deposited over the stair-step electrode. Preferred materials for the piezoelectric film (1) include aluminum nitride, and zinc oxide. Also, the substrate (8) is partially removed, to create a thin membrane (3). The resulting device is shown in FIG. 6E. The piezoelectric film (1) deposited over this gradually sloping edge has less of a tendency to crack than prior art films.

In a third embodiment of the invention, a continuously smoothed dome is achieved through specific use of lithography, deposition and etching steps. The doming decreases the effects of the edge of the electrode on membrane integrity. It is accomplished by melting or reflowing resist with solvent into a drop shape. The resist and material underneath it are then simultaneously etched and the shape is thus transferred.

FIGS. 7A through 7D are an illustration of the process steps for producing a continuously smoothed dome electrode.

This technique is based upon development of a process such that, for a selected etchant, the resist and masking material will have comparable etch rates. Under these circumstances, as the etch proceeds the resist's vertical profile will be mimicked in the electrode profile. For example, if the electrode (2) and resist removal rate are equal the vertical profile of the resist will be exactly reproduced in the electrode (2) beneath the resist. If however the resist is removed only half as fast as the underlying electrode (2), the pattern will be transferred to the underlying electrode (2) but any step or dome height formerly in the resist will be doubled since the underlying material is etched twice as fast.

One technique for implementing this process begins (FIG. 7A) by coating an electrode (2) with photo resist, which is exposed and developed into "hockey-puck" cylinders (42). Using a pre-determined heating schedule (heat at 80° C., then 150° C. for 10 minutes at each temperature, for example), the photo resist cylinders (42) melt into dome shaped "drops (43)," producing a spherical resist profile (FIG. 7B).

Figure 7A:
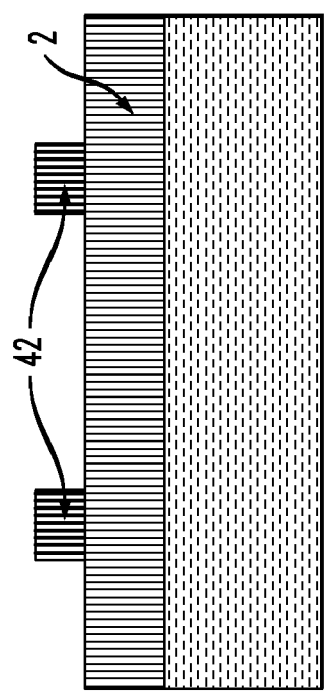
FIG. 7A shows a schematic representation of a coated and etched electrode with "hockey puck" cylinders.
Figure 7C:
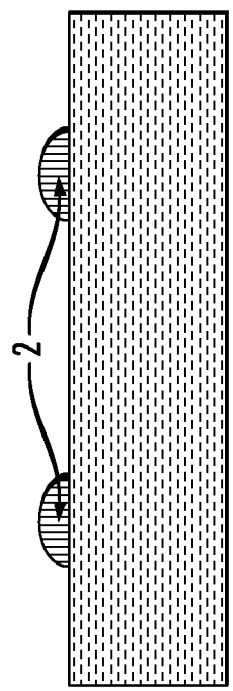
FIG. 7C shows a schematic representation of the device of FIG. 7B, after etching of the electrode.
Figure 7B:
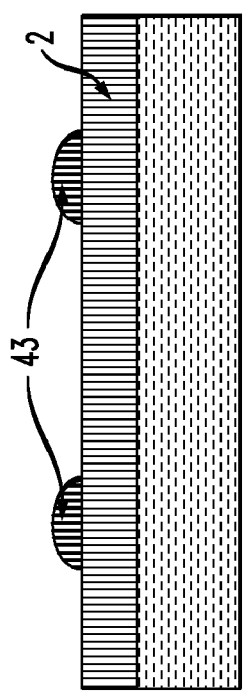
FIG. 7B shows a schematic representation of the device of FIG. 7A, after the cylinders are melted into dome-shaped "drops".

Then, utilizing an etching process (for example, reactive ion etching, wet chemistry or focus ion beam milling (FIB)), the resist layer (43) and electrode (2) are then etched at the required rates to possess a domelike shape in the electrode (FIG. 7C). The gradual slope of the dome minimizes the risk of cracks in a membrane structure.

Figure 7D:
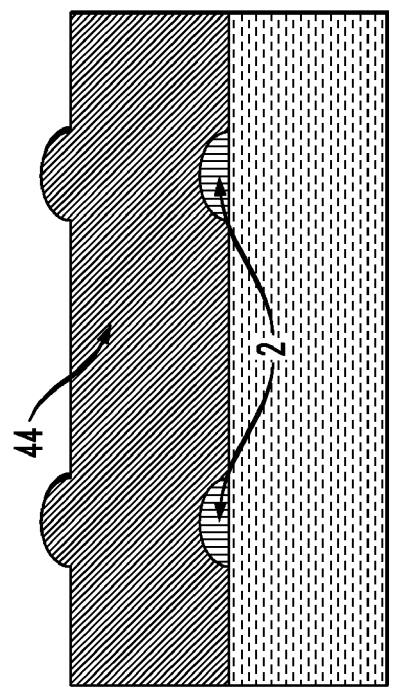
FIG. 7D shows a schematic representation of the device of FIG. 7C, after the deposition of aluminum nitride.

Finally, FIG. 7D shows a completed device. A layer of aluminum nitride (44) has been added to coat the domed electrodes (2). Cracking is eliminated due to the tapered metal edge.

Related U.S. patent application Ser. No. 09/571,919, filed May 16, 2000, entitled "A Method for Shaping Thin-Film Resonators to Shape Acoustic Modes Therein" is herein incorporated by reference.

FIGS. 8A-8I show a fourth embodiment where the electrode is patterned as a final step in the process instead of during the initial steps.

Figure 8A:
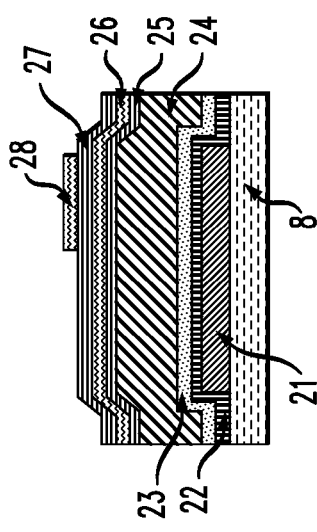
FIG. 8A shows a schematic representation of a device containing a substrate and a non-conducting mask material, the starting material for a fourth embodiment of the invention.
Figure 8B:
FIG. 8B shows a schematic representation of the device of FIG. 8A, after the non-conducting material has been etched.
Figure 8C:
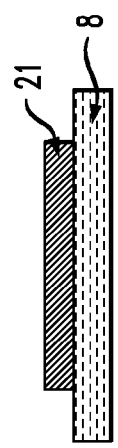
FIG. 8C shows a schematic representation of the device of FIG. 8B, after the deposition of multiple layers of metal and a piezoelectric layer.

In this embodiment, a very thin layer of a non-conducting material (21) is deposited on a substrate (8). The non-conducting material (21) has a low dielectric constant. Preferable non-conducting materials (21) include $SiO_2$ and SiN. The substrate (8) is preferably Si or GaAs. The resulting wafer is shown in FIG. 8A.

The thin, non-conducting material (21) is first patterned into the shape desired for the patterned electrode in the finished device. This step results in the wafer shown in FIG. 8B.

Then, a first layer (22) of metal is deposited everywhere. Subsequently, a second layer (23) of a different metal is deposited. These two layers (22) and (23) preferably are Ti and Al, respectively, and while left unpatterned at this point, will ultimately form the patterned base electrode. Subsequently, a layer (24) of piezoelectric material is deposited on the metal layer (23). Preferred materials for the piezoelectric film (1) include aluminum nitride, and zinc oxide. The structure is completed with the deposition of a counter electrode (25) and (26) a resonator "shifting" material (27), and a top metallic electrode layer (28).

Figure 8D:
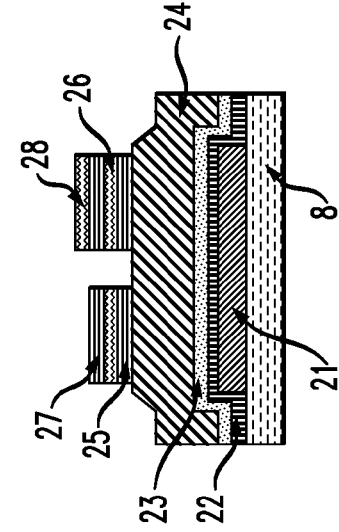
FIG. 8D shows a schematic representation of the device of FIG. 8C, after the top metallic electrode has been patterned.
Figure 8E:
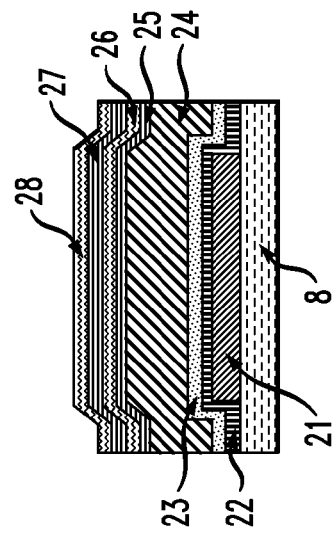
FIG. 8E shows a schematic representation of the device of FIG. 8D, after three additional metallic electrode layers have been patterned.

The top electrode (28) is patterned and etched, resulting in the device shown in FIG. 8D, and the counter electrode (25) and (26) a resonator "shifting" material (27) are patterned and etched, resulting in the intermediate device shown in FIG. 8E.

Next (FIG. 8F)t, another masking layer (29), preferably composed of AlN, is deposited on the substrate's (8) backside. This layer is patterned and etched, resulting in the intermediate device shown in FIG. 8G.

Then, reactive ion etching etches the areas which are not covered by the masking layer (29) on the backside of the wafer. This etch continues all the way through the substrate, to the non-conducting layer (21), resulting in FIG. 8H.

A subsequent reactive ion etching etch removes the metal layers (22) and (23) specifically where they are not protected by this non-conducting layer (21). This results in metal layers (22) and (23) being patterned in the same manner as the non-conducting layer, producing the patterned base electrode. However, because the base electrode topology is not introduced until after the deposition of the piezoelectric material, there is no cracking of this layer (21). The completed device is shown in FIG. 8I.

The different embodiments are preferred under different criteria. The choice to use one embodiment of the invention versus another may depend on the availability of the equipment to the researcher or manufacturer. In addition, the price of obtaining additional equipment may dictate which process is utilized to create a more robust membrane.

Accordingly, it is to be understood that the embodiments of the invention herein described are merely illustrative of the application of the principles of the invention. Reference herein to details of the illustrated embodiments is not intended to limit the scope of the claims, which themselves recite those features regarded as essential to the invention.

The invention claimed is:

1. A method of forming a thin film acoustic device having a piezoelectric film between a first electrode and a second electrode that enable application of an electric field to the piezoelectric film, the method comprising:
   (a) providing a substrate;
   (b) depositing a layer of non-conducting material on a first side of the substrate;
   (c) patterning the layer of non-conducting material to expose a portion of the first side of the substrate;
   (d) depositing one or more layers of conducting material on the layer of non-conducting material and the exposed portion of the first side of the substrate;
   (e) depositing a layer of piezoelectric material on the one or more layers of conducting material;
   (f) depositing one or more additional layers of material on the layer of piezoelectric material;
   (g) patterning the one or more additional layers to form the first electrode;
   (h) depositing a masking layer on a second side of the substrate;
   (i) patterning the masking layer to expose a portion of the second side of the substrate;
   (j) etching away the exposed portion of the second side of the substrate to expose the patterned layer of non-conducting material and a portion of the one or more layers of conducting material; and (k) etching away the exposed portion of the one or more layers of conducting material to form the second electrode.

2. The method of claim 1, wherein step (g) further comprises patterning the one or more additional layers to form a counter electrode adjacent to the first electrode.

3. The method of claim 1, wherein one of the one or more additional layers is a layer of resonator shifting material.

4. The method of claim 1, wherein:
the substrate is Si or GaAs;
the layer of non-conducting material is $SiO_2$ or SiN;
the one or more layers of conducting material comprise a layer of Ti and a layer of Al; and
the layer of piezoelectric material is aluminum nitride or zinc oxide.

5. The method of claim 1, wherein steps (j) and (k) involve reactive ion etching.

6. The method of claim 1, wherein step (e) is performed prior to step (k).

7. The method of claim 1, wherein step (e) is performed prior to steps (j) and (k).

8. The method of claim 1, wherein step (e) is performed prior to steps (i), (j), and (k).

9. The method of claim 1, wherein step (e) is performed prior to steps (h), (i), (j), and (k).

10. The method of claim 1, wherein a first step is step (a), then step (b), then step (c), then step (d), then step (e), then step (f), then step (g), then step (h), then step (i), then step (j), then step (k).

* * * * *